US012683575B2

(12) United States Patent (10) Patent No.: US 12,683,575 B2
Oshima (45) Date of Patent: Jul. 14, 2026

(54) ACOUSTIC WAVE DEVICE

(71) Applicant: Murata Manufacturing Co., Ltd., Nagaokakyo (JP)

(72) Inventor: Naoki Oshima, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 127 days.

(21) Appl. No.: 18/921,185

(22) Filed: Oct. 21, 2024

(65) Prior Publication Data

US 2025/0167758 A1 May 22, 2025

(30) Foreign Application Priority Data

Nov. 21, 2023 (JP) ................................. 2023-197220

(51) Int. Cl.
H03H 9/02 (2006.01)
(52) U.S. Cl.
CPC ................................ H03H 9/02992 (2013.01)
(58) Field of Classification Search
CPC .............. H03H 9/02; H03H 9/25; H03H 9/64
See application file for complete search history.

(56) References Cited

U.S. PATENT DOCUMENTS

| | | | | |
|---|---|---|---|---|
| 10,270,425 B2 * | 4/2019 | Iwaki | ................. | H03H 9/14535 |
| 11,368,137 B2 * | 6/2022 | Goto | ................. | H03H 9/14532 |
| 11,374,550 B2 * | 6/2022 | Daimon | ................. | H03H 9/25 |
| 11,637,543 B2 * | 4/2023 | Inoue | ................. | H03H 9/25 |
| | | | | 310/313 B |
| 11,962,287 B2 * | 4/2024 | Takeuchi | ................. | H03H 9/145 |
| 12,388,413 B2 * | 8/2025 | Lin | ................. | H03H 9/02992 |

FOREIGN PATENT DOCUMENTS

| | | | | |
|---|---|---|---|---|
| CN | 116436438 A | * | 7/2023 | ........... H03H 9/2405 |
| JP | 2009218761 A | | 9/2009 | |

* cited by examiner

*Primary Examiner* — Andrea Lindgren Baltzell
*Assistant Examiner* — Alan Wong
(74) *Attorney, Agent, or Firm* — Keating & Bennett, LLP

(57) ABSTRACT

An acoustic wave device includes a piezoelectric layer, an IDT electrode including electrode fingers, and a dielectric film covering the IDT electrode. When viewed in a direction orthogonal to a direction in which the electrode fingers extend, an area where adjacent two or more of the electrode fingers overlap one another is an intersecting area. The acoustic wave device further includes a thin-film layer at least a portion of which is embedded in the dielectric film, at least a portion of which overlaps the intersecting area in a plan view, an entirety of which does not overlap the electrode fingers in a plan view, having a higher density than the dielectric film, and having a smaller thickness than the electrode fingers. The electrode fingers and the thin-film layer are located at different positions in a thickness direction of the dielectric film.

13 Claims, 6 Drawing Sheets

ACOUSTIC WAVE DEVICE

CROSS REFERENCE TO RELATED APPLICATIONS

This application claims the benefit of priority to Japanese Patent Application No. 2023-197220 filed on Nov. 21, 2023. The entire contents of this application are hereby incorporated herein by reference.

BACKGROUND OF THE INVENTION

1. Field of the Invention

The present invention relates to acoustic wave devices.

2. Description of the Related Art

Acoustic wave devices have been widely used, for example, as filters in mobile phones. Japanese Unexamined Patent Application Publication No. 2009-218761 discloses an example of a boundary acoustic wave device serving as an acoustic wave device. This acoustic wave device includes an insulating layer on a piezoelectric substrate. At a boundary between the piezoelectric substrate and the insulating layer, a comb-shaped electrode is disposed.

For size reduction or for adjustment of the band width, the acoustic wave device described in Japanese Unexamined Patent Application Publication No. 2009-218761 or another device needs a change of its processing conditions or the design of the comb-shaped electrode. However, the change of the processing conditions or the design of the comb-shaped electrode is more likely to change the characteristics of modes other than a main mode.

For example, when the duty ratio in the comb-shaped electrode is increased for size reduction of the acoustic wave device, the difference between the frequency at which a main mode occurs and a frequency at which unnecessary waves occur is also changed. Alternatively, when the thickness of the comb-shaped electrode is increased to reduce the velocity of the acoustic waves for size reduction of the acoustic wave device, the processing on the comb-shaped electrodes may be largely varied, and the yield may be lowered. In addition, the change of the processing conditions or the design of the comb-shaped electrode may change the frequency at which unnecessary waves such as a higher-order mode occur, or a stopband frequency. Thus, when the acoustic wave device is used as, for example, a filter device, the characteristics in a pass band of, for example, the filter device may be lowered.

SUMMARY OF THE INVENTION

Example embodiments of the present invention provide acoustic wave devices that each enable easy adjustment of a band width and size reduction without changing the characteristics of modes other than a main mode.

An acoustic wave device according to an example embodiment of the present invention includes a piezoelectric layer, an IDT electrode on the piezoelectric layer and including a plurality of electrode fingers, and a dielectric film on the piezoelectric layer to cover the IDT electrode. When viewed in a direction orthogonal or substantially orthogonal to a direction in which the plurality of electrode fingers extend, an area where adjacent two or more of the plurality of electrode fingers overlap one another is an intersecting area. The acoustic wave device further includes a thin-film layer at least a portion of which is embedded in the dielectric film, at least a portion of which overlaps the intersecting area in a plan view, an entirety or substantially an entirety of which does not overlap the plurality of electrode fingers in a plan view, which has a higher density than the dielectric film, and which has a smaller thickness than the plurality of electrode fingers. The plurality of electrode fingers and the thin-film layer are located at different positions in a thickness direction of the dielectric film.

Acoustic wave devices according to example embodiments of the present invention each enable easy adjustment of a band width and size reduction without changing the characteristics of modes other than a main mode.

The above and other elements, features, steps, characteristics and advantages of the present invention will become more apparent from the following detailed description of the example embodiments with reference to the attached drawings.

DETAILED DESCRIPTION OF THE EXAMPLE EMBODIMENTS

Specific example embodiments of the present invention are described below with reference to the drawings to clarify the present invention.

Each example embodiment described herein is a mere example, and components between different example embodiments may be partially replaced or combined with each other.

Figure 1:
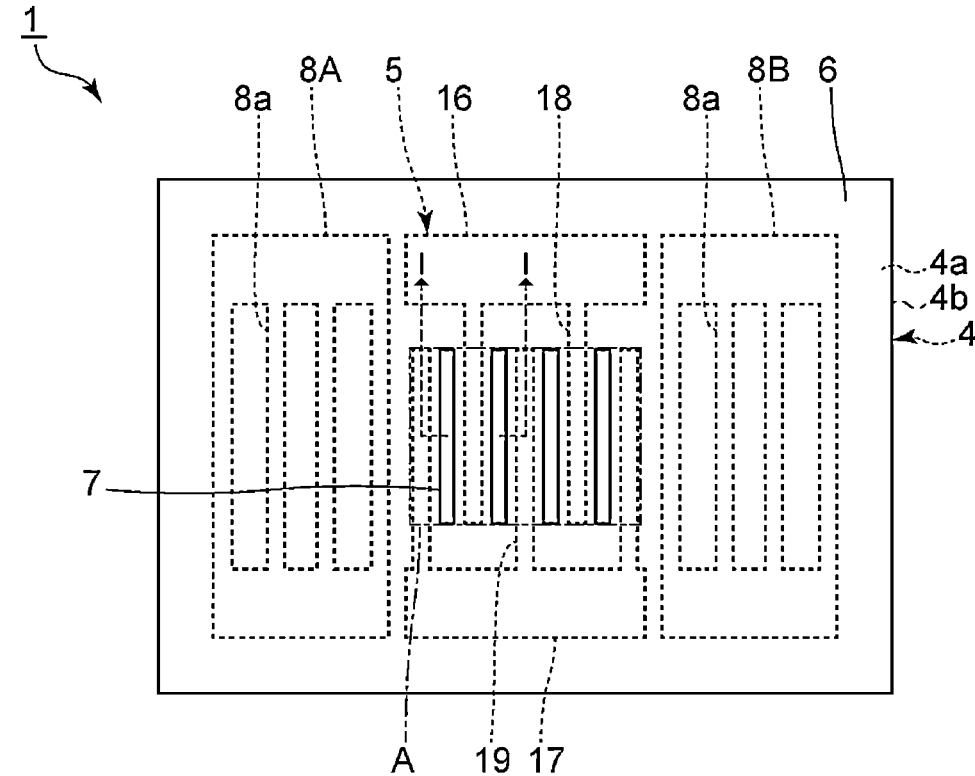
FIG. 1 is a schematic plan view of an acoustic wave device according to a first example embodiment of the present invention.

FIG. 1 is a schematic plan view of an acoustic wave device according to a first example embodiment of the present invention. FIG. 1 omits illustration of a second dielectric film described later.

As illustrated in FIG. 1, an acoustic wave device 1 includes a piezoelectric layer 4, an interdigital transducer (IDT) electrode 5, a dielectric film 6, and multiple thin-film layers 7. The IDT electrode 5 is disposed on the piezoelectric layer 4. The dielectric film 6 is disposed on the piezoelectric layer 4 and covers the IDT electrode 5. The multiple thin-film layers 7 are embedded in the dielectric film 6.

The piezoelectric layer 4 includes a first main surface 4a and a second main surface 4b. The first main surface 4a and the second main surface 4b are opposite to each other. The IDT electrode 5 and the dielectric film 6 are disposed on the first main surface 4a.

The material of the piezoelectric layer 4 may be, for example, lithium tantalate, lithium niobate, zinc oxide, aluminum nitride, crystal, or lead zirconate titanate (PZT). Preferably, for example, lithium tantalate or lithium niobate may be used as a material of the piezoelectric layer 4.

Figure 2:
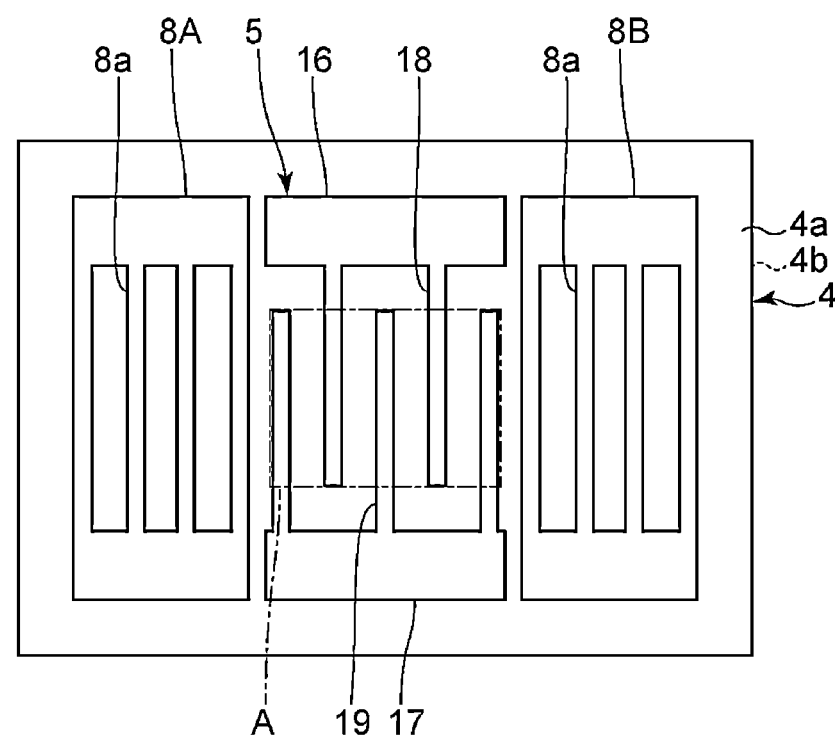
FIG. 2 is a schematic plan view of an electrode structure on a first main surface of a piezoelectric layer, illustrating the structure of an IDT electrode according to the first example embodiment of the present invention.

FIG. 2 is a schematic plan view of an electrode structure on a first main surface of the piezoelectric layer, illustrating the structure of an IDT electrode according to the first example embodiment.

The IDT electrode 5 includes a pair of busbars, and multiple electrode fingers. More specifically, the pair of busbars include a first busbar 16 and a second busbar 17. The first busbar 16 and the second busbar 17 face each other. More specifically, the multiple electrode fingers include multiple first electrode fingers 18 and multiple second electrode fingers 19. First ends of the multiple first electrode fingers 18 are connected to the first busbar 16. First ends of the multiple second electrode fingers 19 are connected to the second busbar 17. The first electrode fingers 18 and the second electrode fingers 19 are connected to different potentials. The multiple first electrode fingers 18 and the multiple second electrode fingers 19 are interdigitated with one another.

Pt, for example, is used as the material of the IDT electrode 5. The material of the IDT electrode 5 is not limited to the above example. Alternatively, for example, the IDT electrode 5 may include a laminated metal film.

Hereinbelow, the first busbar 16 and the second busbar 17 may be simply referred to as busbars. The first electrode fingers 18 and the second electrode fingers 19 may be simply referred to as electrode fingers. The direction in which the multiple electrode fingers extend is referred to as an electrode-finger extension direction, and the direction orthogonal or substantially orthogonal to the electrode-finger extension direction is referred to as an orthogonal-to-electrode-finger direction.

Figure 3:
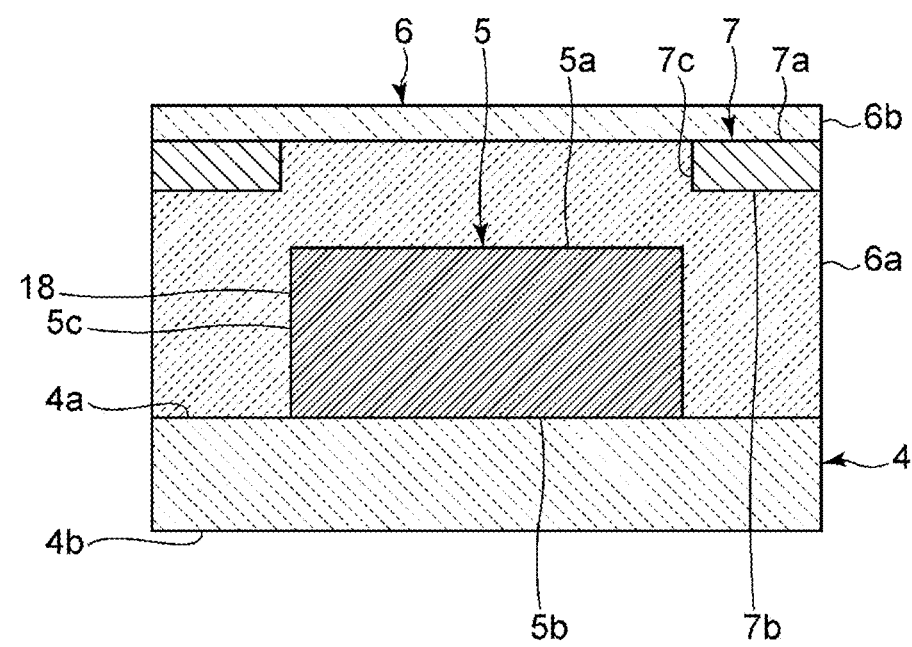
FIG. 3 is a schematic cross-sectional view of a portion around one electrode finger, taken along line I-I in FIG. 1.

FIG. 3 is a schematic cross-sectional view of a portion around one electrode finger, taken along line I-I in FIG. 1.

The dielectric film 6 includes a first dielectric film 6a and a second dielectric film 6b. The first dielectric film 6a is disposed on the piezoelectric layer 4. The second dielectric film 6b is disposed on the first dielectric film 6a. The material of the first dielectric film 6a and the material of the second dielectric film 6b are different from each other. In the present example embodiment, the first dielectric film 6a is made of silicon oxide, for example. The second dielectric film 6b is made of silicon nitride, for example. The materials of the first dielectric film 6a and the second dielectric film 6b are not limited to the above examples. Herein, the expression that a specific member is made of a specific material includes a case where a specific member includes a small amount of impurities that do not greatly reduce the electric characteristics of the acoustic wave device.

In the present example embodiment, the dielectric film 6 includes a two-layer laminated body. The dielectric film 6 may include a laminated body including three or more layers or a single-layer dielectric film.

Each thin-film layer 7 includes a first surface 7a, a second surface 7b, and a side surface 7c. The first surface 7a and the second surface 7b are opposite to each other in the thickness direction of the thin-film layer 7. Of the first surface 7a and the second surface 7b, the second surface 7b is a surface facing the piezoelectric layer 4. The side surface 7c is connected to the first surface 7a and the second surface 7b.

Each thin-film layer 7 is disposed in the dielectric film 6. More specifically, in the present example embodiment, the surfaces other than the first surface 7a are covered with the first dielectric film 6a. In contrast, the first surface 7a is covered with the second dielectric film 6b. Thus, the entirety or substantially the entirety of each thin-film layer 7 is embedded in the dielectric film 6. Instead, at least a portion of each thin-film layer 7 may be embedded in the dielectric film 6.

Herein, the case where the entirety or substantially the entirety of each thin-film layer 7 is embedded in the dielectric film 6 includes a case where the entireties of all of the surfaces of each thin-film layer 7 other than the first surface 7a are covered with the dielectric film 6 and the first surface 7a is not covered with the dielectric film 6. In contrast, for example, a case where a portion of the side surface 7c of each thin-film layer 7 is left uncovered with the dielectric film 6 and the first surface 7a is left uncovered with the dielectric film 6 is regarded as a case where a portion of each thin-film layer 7 is embedded in the dielectric film 6, instead of the entirety of the thin-film layer 7.

As illustrated in FIG. 2, the acoustic wave device 1 includes an intersecting area A. The intersecting area A is an area where adjacent electrode fingers overlap when viewed in the orthogonal-to-electrode-finger direction. The intersecting area A is an area of the piezoelectric layer 4 defined based on the structure of the IDT electrode 5. The intersecting area A can be also said as an area included in the IDT electrode 5, when the structure of the IDT electrode 5 is illustrated.

As illustrated in FIG. 1, the multiple thin-film layers 7 overlap the intersecting area A when viewed in a plan. More specifically, the entireties or substantially the entireties of the multiple thin-film layers 7 overlap the intersecting area A in a plan view. Instead, a portion of any of the thin-film layers 7 may extend to an area not overlapping the intersecting area A in a plan view. Herein, a plan view is a view of the acoustic wave device from a side corresponding to the upper side in FIG. 3. In FIG. 3, for example, of the side nearer the first dielectric film 6a and the side nearer the second dielectric film 6b, the side nearer the second dielectric film 6b is the upper side.

In a plan view, the entirety or substantially the entirety of each thin-film layer 7 does not overlap the electrode fingers. In a plan view, each thin-film layer 7 is located between the electrode fingers. In contrast, in a cross section of the acoustic wave device 1 taken in the orthogonal-to-electrode-finger direction in FIG. 3, each thin-film layer 7 is not located between the electrode fingers. More specifically, in the cross section, each thin-film layer 7 and the electrode fingers do not overlap in the orthogonal-to-electrode-finger direction. Thus, each thin-film layer 7 is not in contact with the piezoelectric layer 4.

More specifically, each electrode finger includes a first surface 5a, a second surface 5b, and a side surface 5c. The first surface 5a and the second surface 5b are opposite to each other in the thickness direction of the electrode finger. Of the first surface 5a and the second surface 5b, the second surface 5b is the surface facing the piezoelectric layer 4. The side surface 5c is connected to the first surface 5a and the second surface 5b. The distance between the first main surface 4a of the piezoelectric layer 4 and the second surface 7b of each thin-film layer 7 is longer than the distance between the first main surface 4a of the piezoelectric layer 4 and the first surfaces 5a of the electrode fingers. Thus, the multiple electrode fingers and the thin-film layers 7 are located at different positions in the thickness direction of the dielectric film 6.

Each thin-film layer 7 has a smaller thickness than the electrode fingers. Each thin-film layer 7 is made of Pt, for example. The material of the thin-film layers 7 is not limited to the above. Each thin-film layer 7 may have any density higher than the density of the dielectric film 6. When the dielectric film 6 is a laminated body, each thin-film layer 7 may have any density higher than the density of a dielectric film in any layer in the dielectric film 6. Each thin-film layer 7 may be made of a metal or a dielectric, for example.

As illustrated in FIG. 2, a pair of reflectors 8A and 8B are disposed on the first main surface 4a of the piezoelectric layer 4. More specifically, the reflectors 8A and 8B face each other with the IDT electrode 5 interposed therebetween in the orthogonal-to-electrode-finger direction. Each of the reflectors 8A and 8B includes multiple reflector electrode fingers 8a. When an alternating current voltage is applied to the IDT electrode 5, acoustic waves used in a main mode are excited in the intersecting area A. The acoustic wave device 1 according to the present example embodiment is, for example, a surface acoustic wave device.

As illustrated in FIG. 1 and FIG. 3, the present example embodiment includes the structure below: 1) at least a portion of each thin-film layer 7 is embedded in the dielectric film 6, at least a portion of each thin-film layer 7 overlaps the intersecting area A in a plan view, and the entirety or substantially the entirety of each thin-film layer 7 does not overlap the multiple electrode fingers in a plan view, 2) each thin-film layer 7 has higher density than the dielectric film 6, and the thin-film layers 7 have a smaller thickness than the multiple electrode fingers, and 3) the multiple electrode fingers and the thin-film layers 7 are located at different positions in the thickness direction of the dielectric film 6. Thus, the band width can be easily adjusted and the size of the acoustic wave device 1 can be reduced without changing the characteristics of modes other than a main mode. The band width is expressed by (|fa−fr|/fr)×100 [%], where the resonant frequency is denoted with fr and the anti-resonant frequency is denoted with fa. The above advantageous effects are described in detail below.

In the present example embodiment, each thin-film layer 7 is embedded in the dielectric film 6 to overlap the intersecting area A in a plan view, and each thin-film layer 7 has higher density than the dielectric film 6. Thus, a mass can be preferably added to the intersecting area A. Thus, the electromechanical coupling coefficient in the main mode can be increased. As the electromechanical coupling coefficient is increased further, the value of the band width is decreased further. Thus, the band width in the main mode can be easily adjusted by adjusting the thickness and the density of each thin-film layer 7 and adjusting the mass added to the intersecting area A. Thus, the band width can be easily adjusted without changing the processing conditions or the design of the IDT electrode 5.

In addition, the addition of the mass from the thin-film layers 7 lowers the acoustic velocity of the acoustic wave propagating over the surface of the piezoelectric layer 4. Thus, the acoustic velocity in the main mode can be lowered. The relationship of f=v/λ0 is satisfied, where the acoustic velocity is denoted with v, the frequency is denoted with f, and the wavelength is denoted with λ0. When the acoustic velocity v is lowered to obtain a desired frequency f, the wavelength λ0 is shortened.

In the acoustic wave device 1, the wavelength is defined by the electrode finger pitch. When the wavelength is denoted with λ and the electrode finger pitch is denoted with p, λ=2p is satisfied. In the present example embodiment, the addition of the mass from the thin-film layers 7 can lower the acoustic velocity in the main mode, and thus the wavelength λ can be shortened. The electrode finger pitch p can thus be reduced. This structure enables size reduction of the IDT electrode 5, and enables size reduction of the entire acoustic wave device 1.

Herein, the electrode finger pitch is a distance between the centers of adjacent electrode fingers in an orthogonal-to-electrode-finger direction. Herein, the distance between adjacent electrode fingers indicates a distance, in the orthogonal-to-electrode-finger direction, between edges of adjacent electrode fingers closer to each other.

In the present example embodiment, each thin-film layer 7 does not overlap the electrode fingers in a plan view. The multiple electrode fingers and the thin-film layers 7 are located at different positions in the thickness direction of the dielectric film 6. Thus, regardless of when each thin-film layer 7 is made of metal, the advantageous effects of the thin-film layer 7 on the electric characteristics of the acoustic wave device 1 can be reduced. The addition of the mass from the thin-film layers 7 enables adjustment of the band width, and reduction of the electrode finger pitch p. As described above, in the present example embodiment, the band width in the main mode can be easily adjusted and the size of the acoustic wave device 1 can be reduced without changing the characteristics of modes other than a main mode.

The advantageous effects of the first example embodiment can be specifically described below. An acoustic wave device prepared as a comparative example differs from the acoustic wave device according to the first example embodiment in that it does not include a thin-film layer. The first example embodiment and the comparative example are compared in terms of impedance frequency characteristics. The design parameters of the acoustic wave device 1 according to the first example embodiment are described as follows. The dimension of the intersecting area A in the electrode-finger extension direction is defined as an intersecting width. The width of each thin-film layer 7 is defined as a dimension of the thin-film layer 7 in the orthogonal-to-electrode-finger direction.

Thin-film layer: formed from Pt, thickness of about 100 nm, and width of about 1 μm First dielectric film: formed from SiO$_2$, and thickness of about 1805 nm Second dielectric film: formed from SiN, and thickness of about 40 nm Intersecting width: about 72 μm Electrode finger pitch: about 2.4 μm Distance between adjacent electrode fingers: about 1.3 μm Electrode fingers: formed from Pt, and thickness of about 500 nm Number of pairs of electrode fingers: 80

Duty ratio of IDT electrode: about 0.45

Number of pairs of reflector electrode fingers: 10

Duty ratio of reflector: about 0.45

The comparative example has the same designed parameters as the first example embodiment, except that it does not include a thin-film layer.

Figure 4:
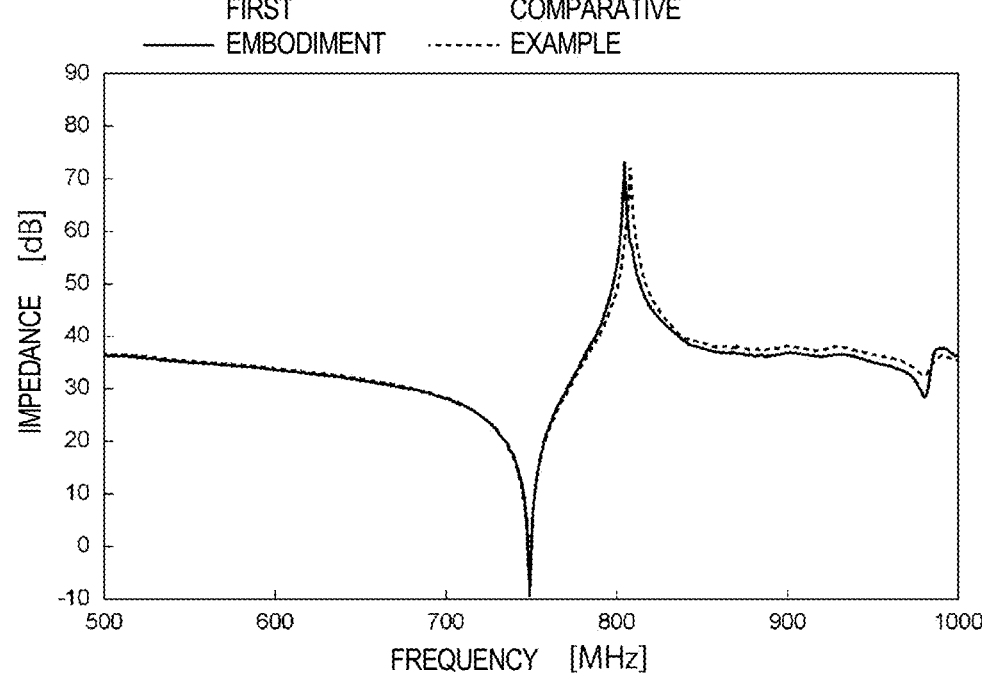
FIG. 4 is a graph of impedance frequency characteristics in the first example embodiment of the present invention and a comparative example.

FIG. 4 is a diagram of impedance frequency characteristics in the first example embodiment of the present invention and a comparative example.

As illustrated in FIG. 4, the difference between the resonant frequency and the anti-resonant frequency is smaller in the first example embodiment than in the comparative example. More specifically, the value of the band width is smaller in the first example embodiment than in the comparative example. More specifically, the band width in the first example embodiment is about 7.58, whereas the band width in the comparative example is about 7.98. When these values are converted into an area ratio of the IDT electrode, the area of the IDT electrode according to the first example embodiment is about 0.995 times of the area of the IDT electrode according to the comparative example. Thus, in the first example embodiment, the size of the acoustic wave device can be reduced.

As illustrated in FIG. 3, in the first example embodiment, the first surface 7a of each thin-film layer 7 is exposed from the first dielectric film 6a. Instead, the first surface 7a of each thin-film layer 7 may be covered with the first dielectric film 6a. Alternatively, the entirety or substantially the entirety of the second surface 7b and a portion of the side surface 7c of each thin-film layer 7 are covered with the first dielectric film 6a, and the remaining portion of the side surface 7c and the entirety or substantially the entirety of the first surface 7a of the thin-film layer 7 may be covered with the second dielectric film 6b.

In the first example embodiment, the thin-film layers 7 are located at portions between all of the electrode fingers in a plan view. The entireties or substantially the entireties of the thin-film layers 7 overlap the intersecting area A in a plan view. The dimension of each thin-film layer 7 in the electrode-finger extension direction corresponds to the intersecting width. The structure of the multiple thin-film layers 7 is not limited to these details. Hereinbelow, first to third modified examples of the first example embodiment that differ from the first example embodiment simply in terms of the arrangement or the dimensions of the thin-film layers 7 are described. In the first to third modified examples, as in the first example embodiment, the band width can be easily adjusted and the size can be reduced without changing the characteristics of modes other than a main mode.

Figure 5:
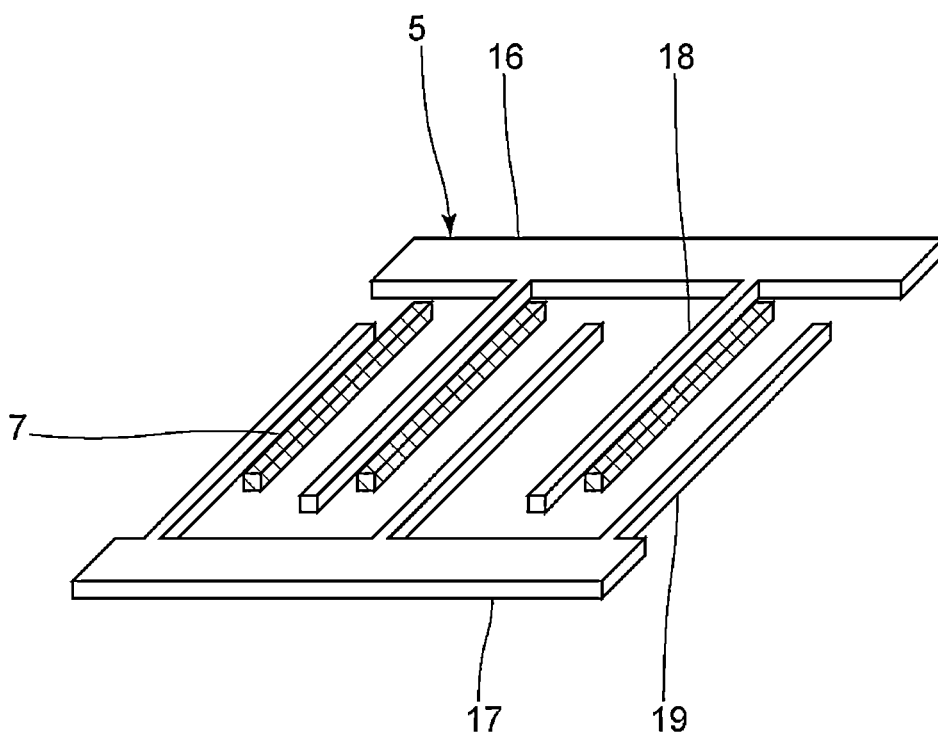
FIG. 5 is a schematic perspective view of an IDT electrode and a thin-film layer according to a first modified example of the first example embodiment of the present invention.

In the first modified example illustrated in FIG. 5, the thin-film layers 7 are located at portions between the multiple electrode fingers in a plan view, and no thin-film layer 7 is located at at least one portion between any two of the electrode fingers. The entireties or substantially the entireties of the thin-film layers 7 overlap the intersecting area in a plan view. In FIG. 5, the thin-film layers 7 are hatched. The same applies to FIG. 6.

Instead, as in the first example embodiment, preferably, the thin-film layers 7 are located at portions between all of the electrode fingers in a plan view. Thus, the mass can be effectively added to the intersecting area. In addition, the mass can be added highly uniformly.

Figure 6:
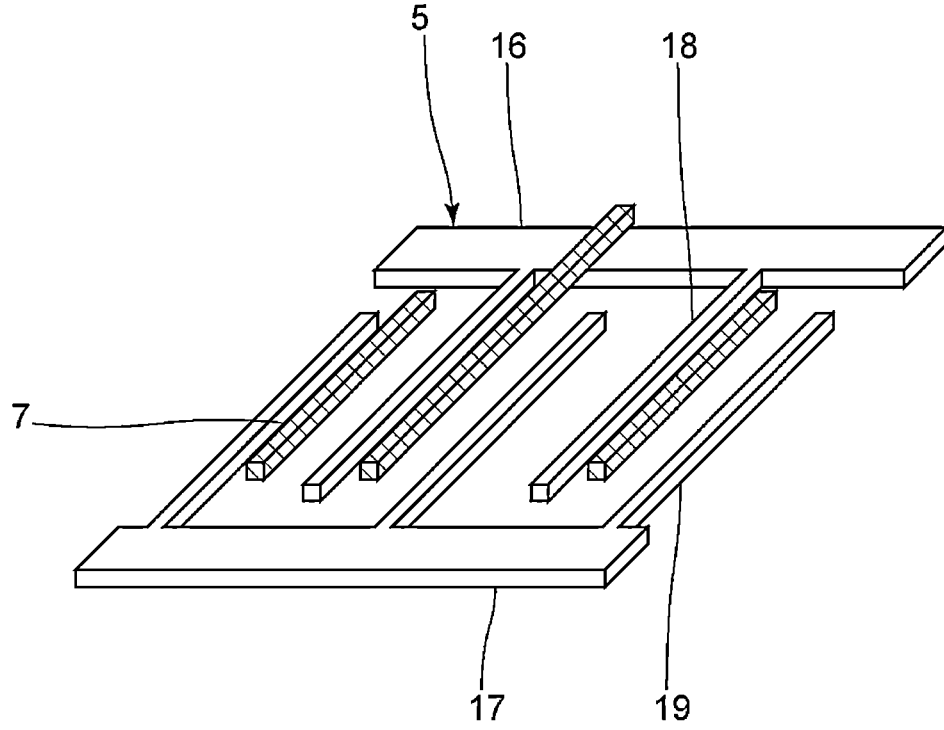
FIG. 6 is a schematic perspective view of an IDT electrode and a thin-film layer according to a second modified example of the first example embodiment of the present invention.

In the second modified example illustrated in FIG. 6, at least one thin-film layer 7 includes a portion overlapping the intersecting area and a portion overlapping a portion outside of the intersecting area in a plan view. This thin-film layer 7 overlaps the first busbar 16 in a plan view. On the other hand, the end of this thin-film layer 7 located closer to the second busbar 17 overlaps the intersecting area in a plan view. Instead, any thin-film layer 7 may overlap both of the first busbar 16 and the second busbar 17 in a plan view. Alternatively, when an end of any thin-film layer 7 in the electrode-finger extension direction overlaps a portion outside of the intersecting area in a plan view, the end may overlap a portion between the busbar and the intersecting area in a plan view.

Figure 7:
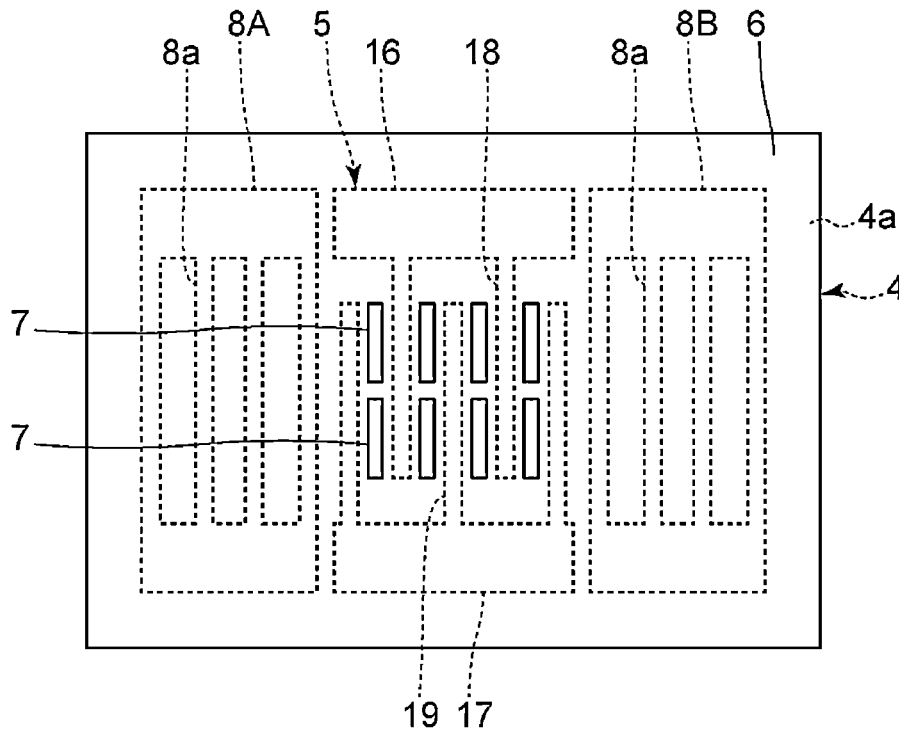
FIG. 7 is a schematic plan view of an acoustic wave device according to a third modified example of the first example embodiment of the present invention.

In the third modified example illustrated in FIG. 7, two thin-film layers 7 overlap a portion between the same electrode fingers in a plan view. The two thin-film layers 7 that overlap a portion between the same electrode fingers in a plan view are arranged in the orthogonal-to-electrode-finger direction. For example, three or more thin-film layers 7 may overlap a portion between the same electrode fingers in a plan view.

Figure 8:
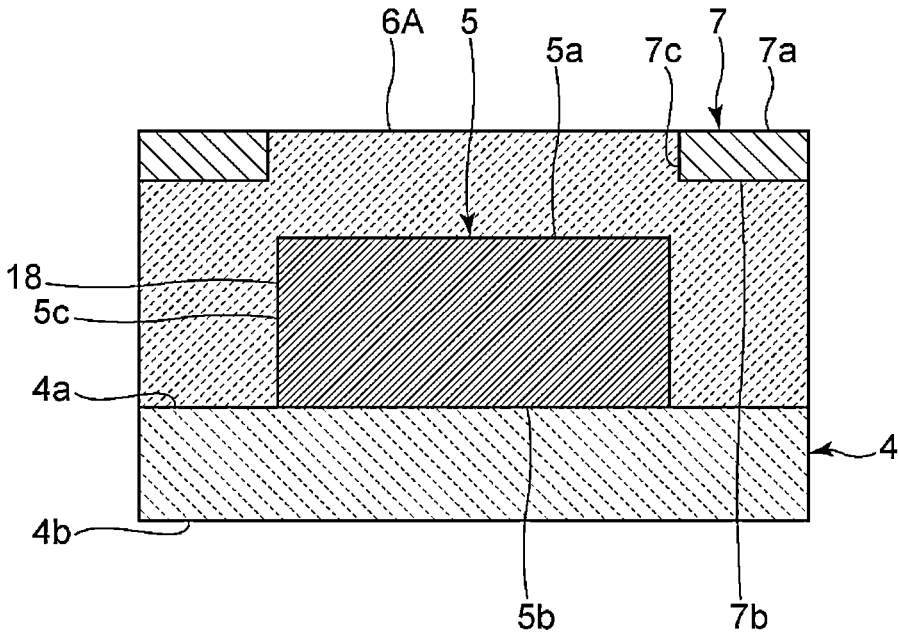
FIG. 8 is a schematic cross-sectional view, viewed from the front, of a portion around one electrode finger according to a fourth modified example of the first example embodiment of the present invention.

In the first example embodiment, the dielectric film 6 includes a laminated body. Instead, the dielectric film 6 may include a single layer film. For example, in the fourth modified example of the first example embodiment illustrated in FIG. 8, a dielectric film 6A includes a single layer film. The dielectric film 6A corresponds to the first dielectric film 6a according to the first example embodiment. The dielectric film 6A is disposed on the piezoelectric layer 4 to cover the IDT electrode 5. The entireties or substantially the entireties of the second surface 7b and the side surface 7c of each thin-film layer 7 are covered with the dielectric film 6A. In contrast, the first surface 7a of each thin-film layer 7 is exposed from the dielectric film 6A. As in the first example embodiment, also in the present modified example, the band width can be easily adjusted and the size can be reduced without changing the characteristics of modes other than a main mode.

In the present modified example, the entirety or substantially the entirety of each thin-film layer 7 is embedded in the dielectric film 6A. Instead, for example, a portion of each thin-film layer 7 may be embedded in the dielectric film 6A. More specifically, the entirety or substantially the entirety of the second surface 7b and a portion of the side surface 7c of the thin-film layer 7 may be covered with the dielectric film 6A, and the remaining portion of the side surface 7c and the entirety or substantially the entirety of the first surface 7a of the thin-film layer 7 may be exposed from the dielectric film 6A. Also in this case, the band width can be easily adjusted and the size can be reduced without changing the characteristics of modes other than a main mode.

Instead, preferably, the entirety or substantially the entirety of each thin-film layer 7 is embedded in the dielectric film 6A. In this structure, each thin-film layer 7 is less easily broken. As in the first example embodiment illustrated in FIG. 3, preferably, each thin-film layer 7 is located in the dielectric film 6. The state where each thin-film layer 7 is located in the dielectric film 6 indicates the state where all of the surfaces of each thin-film layer 7 are covered with the dielectric film 6. In this structure, each thin-film layer 7 is further less easily broken.

In the first example embodiment, the material of the thin-film layers 7 is the same as the material of the electrode fingers. This structure can reduce the number of materials used, and improve the productivity of the acoustic wave device 1. In addition, the thin-film layers 7 are made of a metal material. Thus, the thin-film layers 7 are made of a material with higher density, and facilitate addition of the mass to the intersecting area A.

Figure 9:
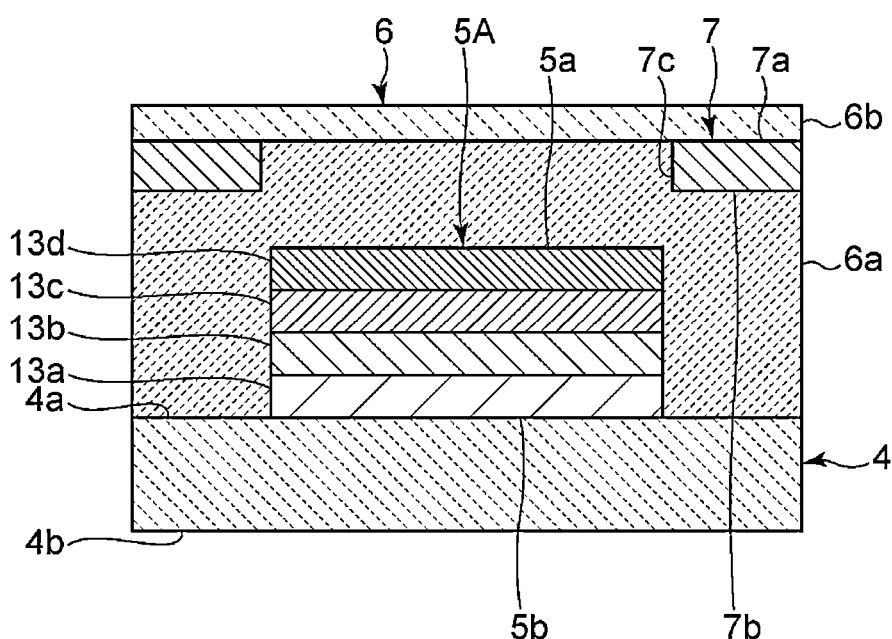
FIG. 9 is a schematic cross-sectional view, viewed from the front, of a portion around one electrode finger according to a fifth modified example of the first example embodiment of the present invention.

The electrode fingers may include a laminated metal film. For example, in the fifth modified example of the first example embodiment illustrated in FIG. 9, each electrode finger of an IDT electrode 5A includes a metal layer 13a, a metal layer 13b, a metal layer 13c, and a metal layer 13d defining and functioning as multiple metal layers. The metal layer 13a, the metal layer 13b, the metal layer 13c, and the metal layer 13d are laminated in this order from the piezo-electric layer 4. In this structure, the first surface 5a of each electrode finger is the surface of the metal layer 13d farther from the piezoelectric layer 4. The second surface 5b of each electrode finger is a surface of the metal layer 13a facing the piezoelectric layer 4. Instead, when each electrode finger includes multiple metal layers, the multiple metal layers may be other than four layers.

In the present modified example, the material of the thin-film layers 7 is the same as the material of any of the multiple metal layers. As in the present modified example or the first example embodiment, when the material of the thin-film layers 7 is the same as the material of at least a part of any of the electrode fingers, the productivity of the acoustic wave device can be enhanced, and the mass can be preferably added to the intersecting area. Instead, the mate-rial of the thin-film layers 7 may be different from the material of any of the metal layers of each electrode finger. For example, the density of the thin-film layers 7 may be higher than the density of all the metal layers.

Also in the present modified example, as in the first example embodiment, the band width can be easily adjusted and the size can be reduced without changing the charac-teristics of modes other than a main mode.

An example case of designed parameters of the acoustic wave device 1 according to the first example embodiment is described above. The parameters may be, for example, within the example ranges described below. The electrode finger pitch may be greater than or equal to 0.62 μm and smaller than or equal to 3 μm, for example. The distance between adjacent electrode fingers may be greater than or equal to 0.31 μm and smaller than or equal to 1.5 μm, for example. The thickness of the thin-film layers 7 may be within the range of greater than or equal to 10 nm and smaller than or equal to 300 nm, for example. The width of the thin-film layers 7 may be within the range of greater than or equal to 0.31 μm, and smaller than or equal to 1.5 μm, for example.

Figure 10:
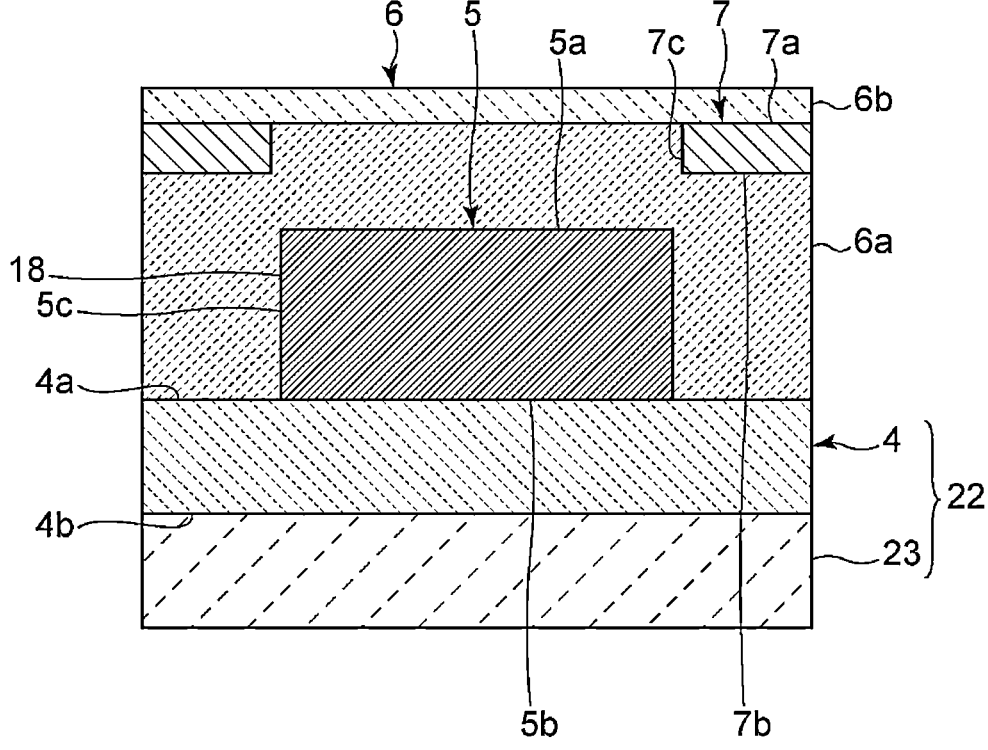
FIG. 10 is a schematic cross-sectional view, viewed from the front, of a portion around one electrode finger according to a second example embodiment of the present invention.

FIG. 10 is a schematic cross-sectional view, viewed from the front, of a portion around one electrode finger according to a second example embodiment of the present invention.

The present example embodiment differs from the first example embodiment in that the piezoelectric layer 4 and a support substrate 23 are laminated to define a piezoelectric substrate 22. The piezoelectric substrate 22 includes a sub-strate with piezoelectricity. Except for the above point, the acoustic wave device according to the present example embodiment has the same or substantially the same structure as the acoustic wave device 1 according to the first example embodiment.

Also in the present example embodiment, as in the first example embodiment, at least a portion of any of the thin-film layers 7 is embedded in the dielectric film 6, at least a portion of any of the thin-film layers 7 overlaps the intersecting area in a plan view, and the entirety or substan-tially the entirety of each thin-film layer 7 does not overlap the multiple electrode fingers in a plan view. Each thin-film layer 7 has higher density than the dielectric film 6, and the thin-film layer 7 has a smaller thickness than the electrode fingers. The multiple electrode fingers and the thin-film layers 7 are located at different positions in the thickness direction of the dielectric film 6. Thus, the band width can be easily adjusted, and the size of the acoustic wave device can be reduced without changing the characteristics of modes other than a main mode.

Figure 11:
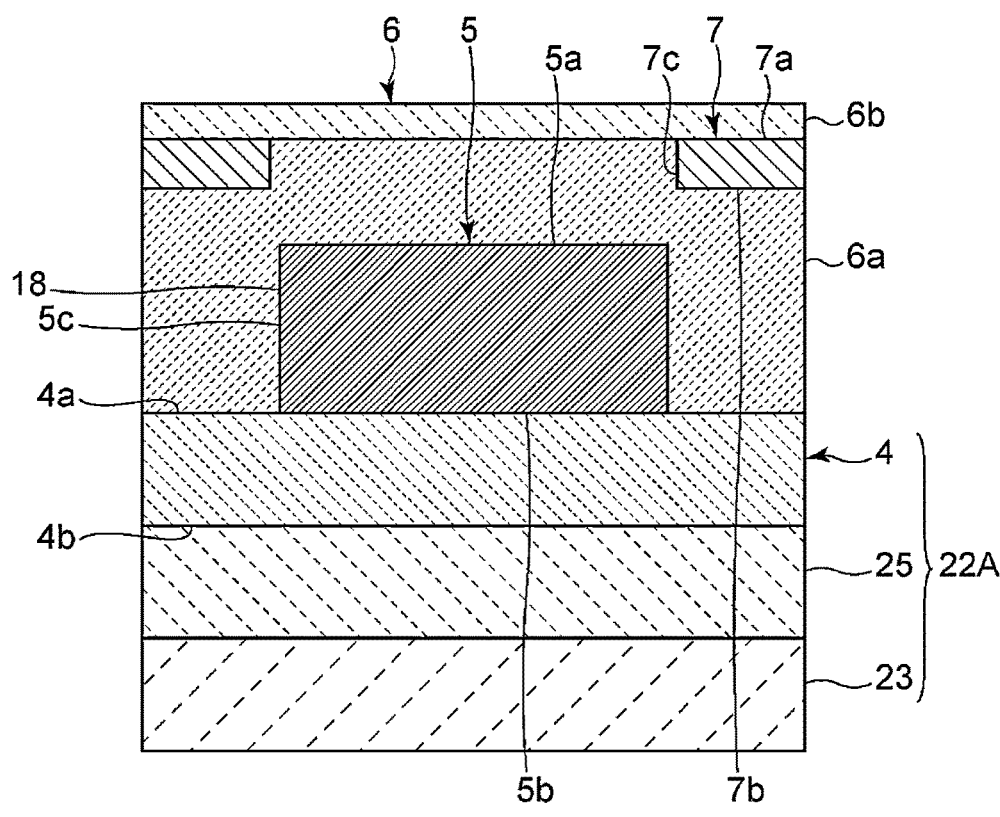
FIG. 11 is a schematic cross-sectional view, viewed from the front, of a portion around one electrode finger according to a modified example of the second example embodiment of the present invention.

In the piezoelectric substrate 22, the piezoelectric layer 4 is disposed directly on the support substrate 23. However, this is not the only possible example. For example, a piezoelectric substrate 22A according to a modified example of the second example embodiment illustrated in FIG. 11 includes a support substrate 23, an intermediate layer 25, and a piezoelectric layer 4. The intermediate layer 25 is disposed on the support substrate 23. The piezoelectric layer 4 is disposed on the intermediate layer 25. In this manner, the piezoelectric layer 4 is indirectly disposed on the support substrate 23 with the intermediate layer 25 interposed ther-ebetween. In the present modified example, the intermediate layer 25 includes a single dielectric layer. The material of the intermediate layer 25 may be, for example, a dielectric substance such as silicon oxide, tantalum oxide, or silicon nitride. The intermediate layer 25 may have a laminated body including multiple dielectric layers.

Also in the present modified example, as in the second example embodiment, the band width can be easily adjusted, and the size of the acoustic wave device can be reduced without changing the characteristics of modes other than a main mode.

While example embodiments of the present invention have been described above, it is to be understood that variations and modifications will be apparent to those skilled in the art without departing from the scope and spirit of the present invention. The scope of the present invention, there-fore, is to be determined solely by the following claims.

What is claimed is:

1. An acoustic wave device comprising:
a piezoelectric layer;
an interdigital transducer (IDT) electrode on the piezo-electric layer, and including a plurality of electrode fingers; and
a dielectric film on the piezoelectric layer and covering the IDT electrode; wherein
when viewed in a direction orthogonal or substantially orthogonal to a direction in which the plurality of electrode fingers extend, an area where adjacent two or more of the plurality of electrode fingers overlap one another is an intersecting area;
the acoustic wave device further includes a thin-film layer at least a portion of which is embedded in the dielectric film, at least a portion of which overlaps the intersect-ing area in a plan view, an entirety or substantially an entirety of which does not overlap the plurality of electrode fingers in the plan view, having a higher density than the dielectric film, and having a smaller thickness than the plurality of electrode fingers; and
the plurality of electrode fingers and the thin-film layer are located at different positions in a thickness direction of the dielectric film.

2. The acoustic wave device according to claim 1, wherein
the dielectric film includes a first dielectric film on the piezoelectric layer, and a second dielectric film on the first dielectric film; and
a material of the first dielectric film and a material of the second dielectric film are different from each other.

3. The acoustic wave device according to claim 2, wherein
the first dielectric film includes silicon oxide; and
the second dielectric film includes silicon nitride.

4. The acoustic wave device according to claim 1, wherein
the entirety or substantially the entirety of the thin-film layer
is embedded in the dielectric film.

5. The acoustic wave device according to claim 1, wherein
a material of the thin-film layer is the same as a material of
at least a portion of any of the electrode fingers.

6. The acoustic wave device according to claim 5, wherein
each of the plurality of electrode fingers includes a
plurality of metal layers; and
the material of the thin-film layer is the same as a material
of any of the plurality of metal layers.

7. The acoustic wave device according to claim 1, further
comprising:
a support substrate; wherein
the piezoelectric layer is on the support substrate.

8. The acoustic wave device according to claim 1, wherein
the piezoelectric layer includes lithium tantalate, lithium
niobate, zinc oxide, aluminum nitride, crystal, or lead zir-
conate titanate.

9. The acoustic wave device according to claim 1, wherein
the piezoelectric layer includes lithium tantalate or lithium
niobate.

10. The acoustic wave device according to claim 1,
wherein the IDT electrode includes Pt.

11. The acoustic wave device according to claim 1,
wherein the IDT electrode includes a laminated metal film.

12. The acoustic wave device according to claim 1,
wherein the thin-film layer includes Pt.

13. The acoustic wave device according to claim 1, further
comprising a pair of reflectors on the piezoelectric layer with
the IDT electrode interposed therebetween.

\* \* \* \* \*